(12) United States Patent
Mamada

(10) Patent No.: US 6,860,954 B2
(45) Date of Patent: Mar. 1, 2005

(54) CIRCUIT BOARD HAVING THEREON COUPLED CERAMIC CAPACITORS AND METHOD FOR THE MANUFACTURE THEREOF

(75) Inventor: Nobuo Mamada, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 34 days.

(21) Appl. No.: 09/934,495

(22) Filed: Aug. 22, 2001

(65) Prior Publication Data

US 2002/0007908 A1 Jan. 24, 2002

Related U.S. Application Data

(62) Division of application No. 09/441,960, filed on Nov. 17, 1999, now Pat. No. 6,304,425.

(30) Foreign Application Priority Data

Dec. 9, 1998 (JP) .......................................... 10-350382
Aug. 24, 1999 (JP) .......................................... 11-237334

(51) Int. Cl.$^7$ .............................................. C03B 29/00
(52) U.S. Cl. .................... 156/89.12; 29/832; 361/321.2
(58) Field of Search ......................... 29/840, 739, 832; 156/89.12; 361/320, 321.1, 321.2

(56) References Cited

U.S. PATENT DOCUMENTS 6,336,365 B1 * 1/2002 Blackadar et al. ........ 73/514.34

\* cited by examiner

Primary Examiner—Jeff H. Aftergut
Assistant Examiner—John L. Goff
(74) Attorney, Agent, or Firm—Katten Muchin Zavis Rosenman

(57) ABSTRACT

A circuit board having coupled multilayered ceramic capacitors mounted thereon considerably reduces the generation of sounds developed by piezoelectric effects in the capacitors. A method for mounting the capacitors on the circuit board includes the step of forming lands for mounting the capacitors thereon at substantially plane-symmetrical positions on the front surface and the back surface of the circuit board, two lands at their substantially plane-symmetrical positions being connected each other. The capacitors, which are substantially identical each other, are then mounted on the lands of the front and the back surfaces such that the capacitors are disposed at substantially plane-symmetrical positions and electrically coupled to the lands. As a result, vibrations being transferred from the capacitors to the circuit board are cancelled out with each other and the resonance of the circuit board due to the vibrations from the capacitors is prevented, resulting in the generation of audible sounds with high sound pressure levels being considerably reduced compared to that of the prior art.

10 Claims, 4 Drawing Sheets

CIRCUIT BOARD HAVING THEREON COUPLED CERAMIC CAPACITORS AND METHOD FOR THE MANUFACTURE THEREOF

This is a divisional of U.S. application Ser. No. 09/441,960, filed Nov. 17, 1999, now U.S. Pat. No. 6,304,425, entitled Ceramic Board Having Thereon Coupled Ceramic Capacitors & Method For The Manufacture Thereof

FIELD OF THE INVENTION

The present invention relates to a circuit board having thereon coupled multilayered ceramic capacitors capable of reducing generation of sounds caused by piezoelectric effects and a method for mounting the multilayered ceramic capacitors on the circuit board.

DESCRIPTION OF THE PRIOR ART

Aluminum electrolysis capacitors had been widely used as power smoothing capacitors in smoothing circuits of such power supply circuits as DC–DC converters and the like.

However, as the sizes of electronic circuits and devices were scaled down, tantalum electrolysis capacitors, a smaller tantalum electrolysis capacitor being capable of providing a capacitance level obtainable from a larger aluminum electrolysis capacitor, were employed in electronic circuits, e.g., smoothing circuits of power supply circuits, requiring large capacitance.

And, as the electronic circuits and devices are further miniaturized while requiring less power consumption, most of the conventional capacitors employed therein have been rapidly replaced by multilayered ceramic capacitors.

The use of multilayered ceramic capacitors have been rapidly extended since they are small but have excellent reliability and durability.

Since, however, a dielectric material being used in a multilayered ceramic capacitors having a small size but with large capacitance is of the type having a large dielectric constant, vibrations are generated due to piezoelectric effects when AC currents are applied thereto along with DC currents. The vibrations thus generated tend to become stronger as the dielectric constant of the dielectric material becomes greater and the size of the capacitor becomes larger.

Multilayered ceramic capacitors having relatively large sizes and large capacitance are normally employed in the smoothing circuits of the power supply circuits, resulting in such vibrations occurring frequently.

Furthermore, once the vibrations are generated in the multilayered ceramic capacitors as described above, the vibrations of the capacitors are transferred to the circuit board on which the capacitors are mounted; and, therefore, in some cases the circuit board resonates with the vibrations so that sounds can be amplified. That is to say, the vibrations of the capacitors result in the vibration of the surrounding air to produce audible sounds and, at the same time, cause the resonant vibrations of the circuit board to occur. Consequently, sound pressure levels increase, which in turn results in harsh audible sounds being produced.

SUMMARY OF THE INVENTION

It is, therefore, an object of the present invention to provide a circuit board capable of reducing audible sounds generated by piezoelectric effects and a method for mounting multilayered ceramic capacitors on the circuit board.

In accordance with one aspect of the present invention, there is provided a circuit board having an electronic circuit formed thereon, the electronic circuit including a pair of multilayered ceramic capacitors, wherein each of the capacitors includes a body having dielectric layers formed of a dielectric ceramic material and internal electrode layers and a pair of external terminal electrodes formed on two sides of the body, the body being of a substantially hexahedral shape, the dielectric layers and the internal electrode layers being stacked alternately in the body and the internal electrode layers being connected in parallel to the external terminal electrodes in an alternate manner, characterized in that:

the capacitors are disposed at substantially plane-symmetrical positions on two opposite surfaces of the circuit board and substantially identical voltages are applied to the capacitors, wherein the electronic circuit is of a type in which voltages applied to the capacitors have frequencies varying in an audible frequency band.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred embodiment of the present invention will now be described hereinafter with reference to the drawings.

Figure 1:
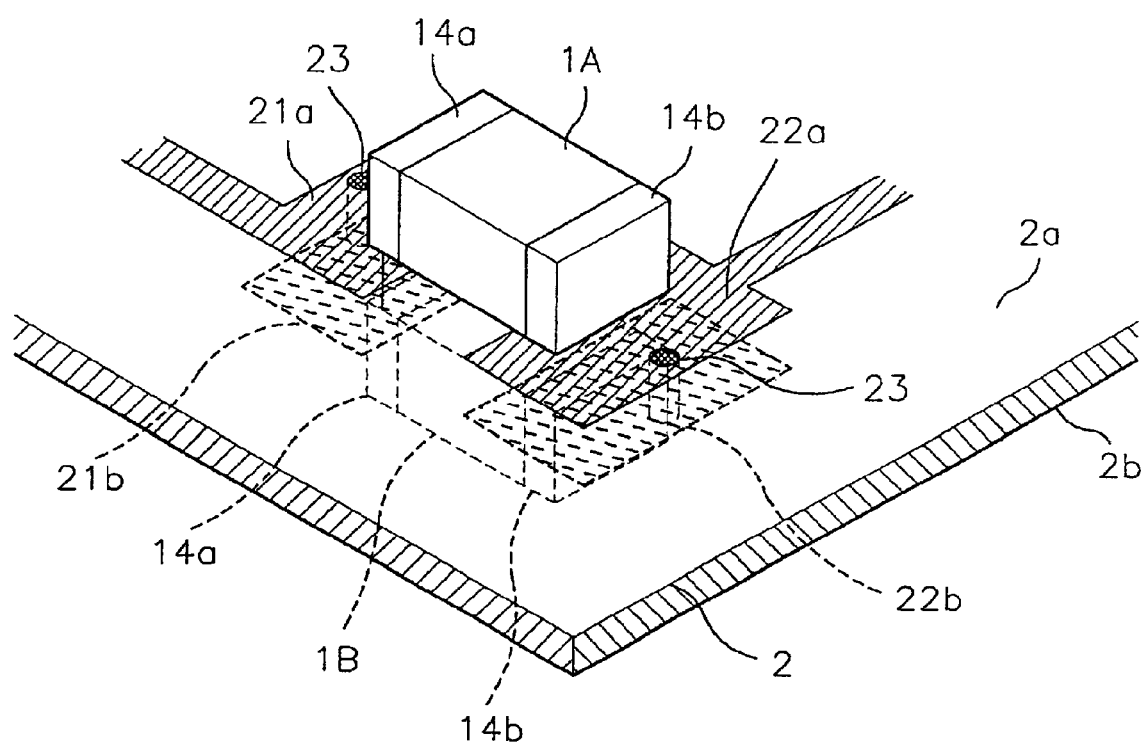
FIG. 1 illustrates a perspective view of multilayered ceramic capacitors mounted on a circuit board in accordance with a preferred embodiment of the present invention.
Figure 2:
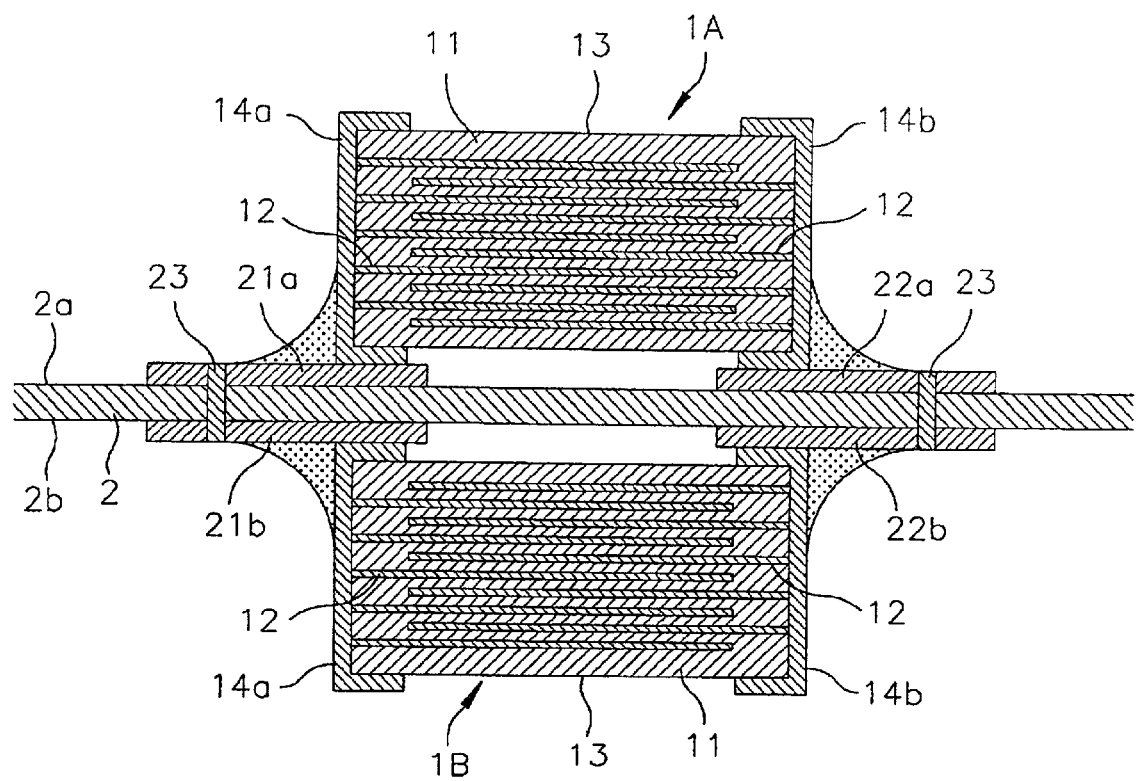
FIG. 2 shows a cross sectional view of the multilayered ceramic capacitors mounted on the circuit board in accordance with the embodiment of the present invention.

FIG. 1 is a perspective view of a circuit board having a pair of multilayered ceramic capacitors mounted thereon and FIG. 2 is a cross sectional view thereof. In FIGS. 1 and 2, reference numerals 1A and 1B represent a pair of multilayered ceramic capacitors (referred to as capacitors hereinafter), each of which includes a body 13 formed by stacking dielectric layers 11 and internal electrodes 12 alternately, and a pair of external electrodes 14a and 14b disposed on two opposite sides of the body 13. The internal electrodes 12 are composed of two sets of alternately disposed internal electrodes and the alternate internal electrodes of each set are connected to one of the external electrodes 14a and 14b in parallel.

Each of the dielectric layers 11 is made of a sintered ceramic in a form of a sheet having a substantially rectangular shape, the sintered ceramic being a dielectric material having, e.g., magnesium titanate as the major component thereof.

Each of the internal electrodes 12 is formed of a metal film of a sintered metal paste, the metal paste being of a type having, e.g., noble metals such as Pd, Ag—Pd or the like as the major component thereof. The external electrodes 14a and 14b can be made of a material identical to that of the internal electrodes 12 and provided with solderable plating layers on the surfaces thereof to improve solder wettability.

In the preferred embodiment of the invention, it is preferable that the capacitors 1a and 1b are identical each other.

However, the capacitors 1a and 1b may not be identical each other but rather they can be constructed to be substantially identical each other, i.e., to be different in some aspects as long as the vibrations generated therefrom can be substantially cancelled out by each other, as will be described hereinafter.

For example, the major factors controlling the degree of cancellation of the vibrations generated from the capacitors in actual use include an electromechanical coupling coefficient, a dielectric constant, a thickness of each layer, and the number of layers, etc. The preferable ranges of these factors required in effecting the cancellation of the vibrations have been obtained from experiments as follows:

An electromechanical coupling coefficient of one of the capacitors 1a and 1b being set to be in the range from about 70% to about 130% of that of the other capacitor.

A dielectric constant of a dielectric material used in one of the capacitors 1a and 1b being set to be in the range from about 50% to about 150% of that of the other capacitor.

A thickness of each layer in one of the capacitors being set to be in the range from about 70% to about 130% of that of the other capacitor in case the number of layers of one of the capacitors 1a and 1b is set to be substantially equal to that of the other capacitor.

The number of layers of one of the capacitors being set to be in the range from about 70% to about 130% of that of the other capacitor in case a thickness of each layer in one of the capacitors 1a and 1b is substantially equal to that of the other capacitor.

The dimensions, i.e., the length, the width and the height of one of the capacitors being set to be in the range from about 70% to about 130% of those of the other capacitor, respectively.

By using capacitors constructed satisfying the conditions described above, vibrations generated therefrom can be substantially reduced.

Reference numeral 2 represents a circuit board, e.g., a single-layered double-sided printed circuit board with two mounting surfaces. Contact pads or lands 21a, 22a and 21b, 22b for mounting the capacitors 1a and 1b are formed on a front surface 2a and a back surface 2b of the circuit board 2, respectively. The lands 21a and 22a are in plane symmetry with the lands 21b and 22b, respectively, and the two lands in plane symmetry are electrically coupled to each other via a through hole 23. That is, the land 21a formed on one side of the front surface 2a is electrically coupled to the land 21b formed on the back surface 2b via the through hole 23; and the land 22a formed on the other side of the front surface 2a is electrically coupled to the land 22b formed on the back surface 2b via the through hole 23. It is to be understood that the circuit board 2 of the present invention can be different types of circuit boards, e.g., a multilayered ceramic circuit board or the like, other than the single-layered double-sided printed circuit board described above.

Interconnection between each pair of coupled lands, i.e., 21a, 21b and 22a, 22b, can be achieved by a combination of a through hole and a wiring pattern, a jumper wiring or the like. That is, any type of interconnection schemes can be employed for the interconnection of each coupled lands as long as identical or substantially identical voltages can be applied to both the capacitors 1a and 1b.

The inventor of the present invention has found from experiments that the cancellation of the vibrations generated from the capacitors can be effected if the voltages applied to the two capacitors are substantially identical each other to satisfy certain criteria defined as follows:

That is, in the electronic circuit having the capacitors 1a and 1b, it is required that a voltage applied to one of the capacitors 1a and 1b be within the range from about 80% to about 120% of that applied to the other capacitor.

In the electronic circuit, a phase offset or difference of a voltage applied to one of the capacitors 1a and 1b with respect to that for the other capacitor is required to be less than about 20% of the phase period of the voltage applied to the other capacitor.

In the electronic circuit with the capacitors 1a and 1b to which DC bias voltages are applied, a DC bias voltage applied to one of the capacitors is required to be in the range from about 80% to about 120% of that applied to the other capacitor.

If substantially identical voltages satisfying any one of the conditions described above are applied to the capacitors 1a and 1b, vibrations being generated by the capacitors can be considerably reduced.

The external electrode 14a of the capacitor 1a mounted on the front surface 2a of the circuit board 2 is electrically coupled to the land 21a by solder and the other external electrode 14b thereof is electrically connected to the land 22a. Similarly, the external electrode 14a of the capacitor 1b mounted on the back surface 2b of the circuit board 2 is electrically connected to the land 21b by solder and the other external electrode 14b thereof is electrically connected to the land 22b.

In order to suppress the vibrations generated from the capacitors 1a and 1b, it is preferable that the capacitors 1a and 1b are mounted on the circuit board 2 in a manner of plane symmetry.

It is, however, virtually impossible to mount two capacitors 1a and 1b on the circuit board in their exactly plane-symmetrical positions. In view of the foregoing, the inventor conducted experiments to determine ranges of offset between the mounting positions of the capacitors which can substantially prevent the vibrations from being generated form the capacitors; and found that the preferable offset ranges between two capacitors mounted on substantially plane-symmetrical positions, which can effect the cancellation of the vibrations, are as follows.

That is, a mounting position of one of the capacitors is required to be displaced from that of the other capacitor such that offsets of the one of the capacitors along directions of a length and a width of the other capacitor are not greater than about 30% of the length and the width of the other capacitor, respectively.

Further, the angle between the center axes along the length directions of the two capacitors mounted on substantially plane-symmetrical positions is required not to be greater than 40 degree.

Figure 3:
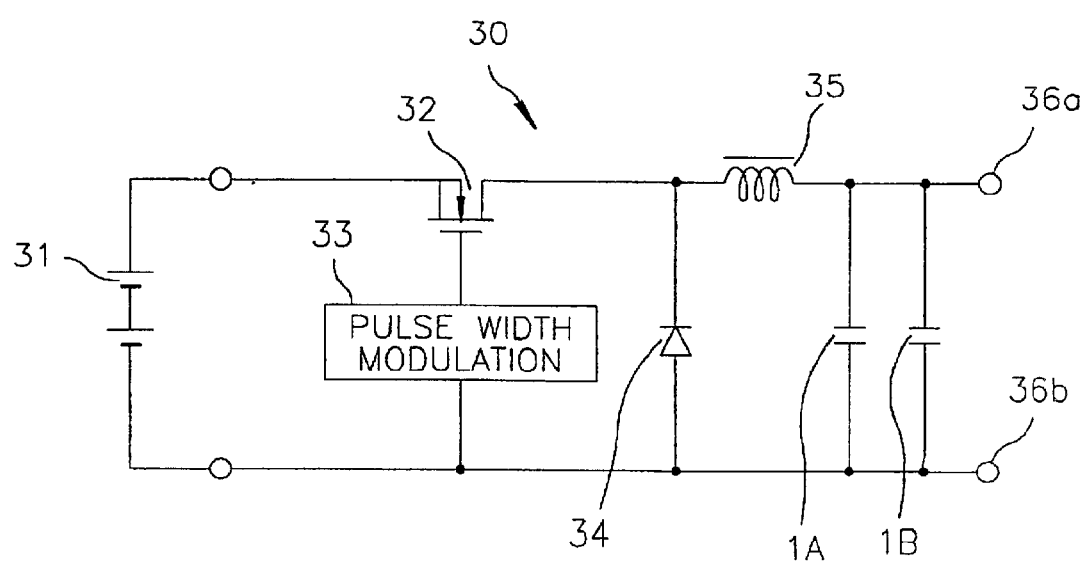
FIG. 3 is a circuit diagram of a DC–DC converter incorporating therein the multilayered ceramic capacitors mounted on the circuit board in accordance with the embodiment of the present invention.

Referring to FIG. 3, there is illustrated an exemplary electronic circuit in accordance with the embodiment of the invention.

FIG. 3 represents a circuit for illustrating a DC–DC converter 30 including therein the capacitors 1a and 1b mounted on a circuit board in a manner described above. In FIG. 3, reference numerals 31, 32, 33, 34 and 35 represent a DC power supply, a P channel FET, a pulse width modulation circuit, a diode and an inductor, respectively, and reference numerals 1a and 1b are the capacitors described above.

A positive terminal of the DC power supply 31 is connected to a source of the FET 32. A drain of the FET 32 is connected to a cathode of the diode 34 and also connected to one external electrode of each of the capacitors 1a and 1b and an output terminal 36a via the inductor 35. An anode of the diode 34 and the other external electrode of the capacitors 1a and 1b are connected to a negative terminal of the DC powers supply 31 and an ground terminal 36b. A voltage $V_{con}$ outputted from the pulse width modulation circuit 33 is fed to a gate of the FET 32.

The pulse width modulation circuit 33 outputs the voltage $V_{con}$ having a pulse width t with a predetermined period T. When the voltage $V_{con}$ is applied to the gate of the FET 32, the FET 32 turns on so that the source and the drain of the FET 32 can be electrically connected each other.

When the FET 32 is on, the source-to-drain current is outputted to the output terminal 36a via the inductor 35. The current is also fed to and charges the capacitors 1a and 1b.

When the FET 32 is off, the current from the DC power supply 31 is blocked by the FET 32; and then the energy accumulated in the inductor 35 discharges by a counter electromotive force and a freewheeling current due to the counter electromotive force flows through the diode 34 and the capacitors 1a and 1b and to the output terminal 36a.

The output voltage $V_o$ on the output terminal 36a can be represented by an output voltage $V_{in}$ of the DC power supply 31 as follows:

$$V_o = V_{in}\frac{t}{T}.$$

That is, the voltage $V_o$ is obtained by multiplying the voltage $V_{in}$ by the pulse width t divided by the period T. Therefore, the output voltage Vo may be arbitrarily adjusted by changing the ratio of the pulse width t to the period T in the pulse width modulation circuit 33.

Since the capacitors 1a and 1b serves to regulate or smooth the output of the DC–DC converter circuit 30, they need be of a large capacitance. Further, besides a DC voltage, an AC voltage is also applied to the capacitors 1a and 1b, resulting in the vibrations of the capacitors 1a and 1b due to piezoelectric effects.

Since, however, the capacitors 1a and 1b of the embodiment of the present invention are mounted on the surfaces 2a and 2b of the circuit board 2 in the manner of the plane symmetry as described above, the vibrations transferred from the capacitors to the circuit board are cancelled out with each other; and, therefore, the circuit board is prevented from being resonated by the vibrations from the capacitors and the development of audible sounds with high sound pressure levels can be considerably reduced.

Figure 4:
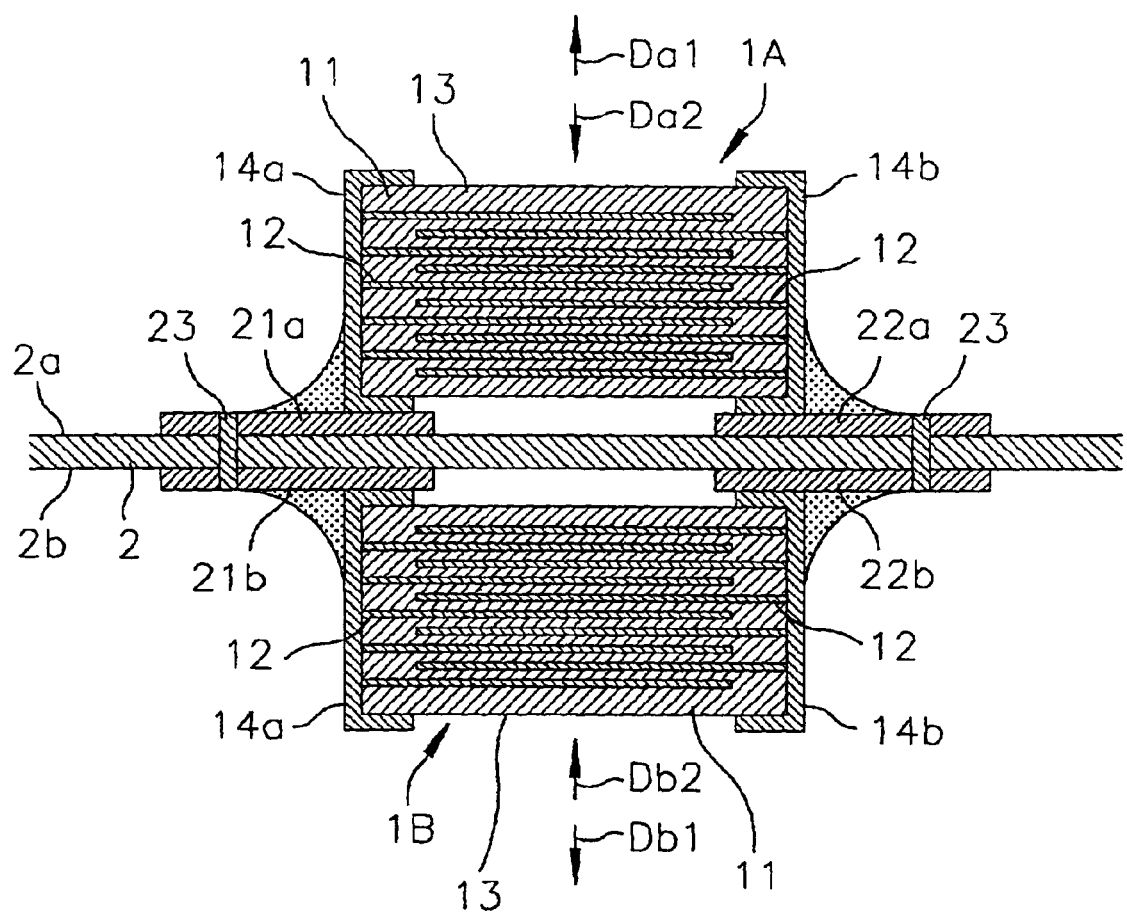
FIG. 4 presents a diagram for illustrating vibrations of the multilayered ceramic capacitors of the embodiment of the present invention.

Specifically, if the capacitor 1a mounted on the front surface 2a of the circuit board 2 vibrates due to the piezoelectric effects as described above, so does the other capacitor 1b mounted on the back surface 2b, as shown in FIG. 4. The vibrations due to the piezoelectric effects include such vibrations generated by various state variations as thickness mode vibrations, thickness shear mode vibrations, planar shear mode vibrations, torsion mode vibrations and distortion mode vibrations. For the sake of illustration, however, only the thickness mode vibrations developed by the deformation along the direction normal to the surfaces of the circuit board 2 will be considered.

The capacitors 1a and 1b of the present invention would also generate vibrations as in prior-art capacitors. Since, however, the capacitors 1a and 1b mounted on the front and the back surface 2a and 2b of the circuit board 2 are of the substantially identical structures and are disposed on the substantially plane-symmetrical positions, directions Da1 and Da2 of state variations developed in the capacitor 1a is opposite to directions Db1 and Db2 of those in the other capacitor 1b.

Figure 5A:
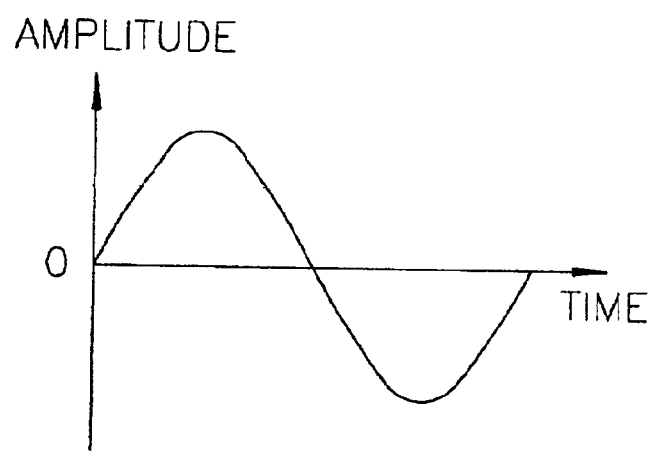
FIGS. 5A and 5B represent waveforms of vibrations generated from two multilayered ceramic capacitors of the embodiment of the present invention, respectively.
Figure 5B:
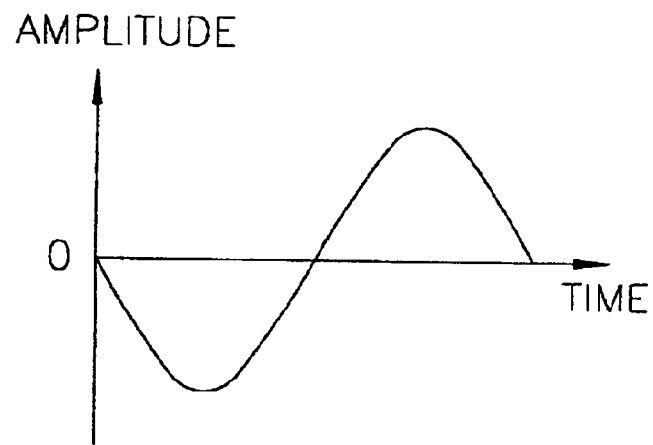

FIGS. 5A and 5B represent waveforms of vibrations generated from the capacitors 1a and 1b, respectively. The waveform of the capacitor 1a is phase-shifted from that of the capacitor 1b by 180 degrees. As a result, the vibrations transferred from the two capacitors 1a and 1b to the circuit board 2 are cancelled out with each other and the resonance of the circuit board 2 is prevented.

Therefore, sounds developed by the vibrations of the two capacitors 1a and 1b would not be amplified so that audible sounds of high sound pressure levels can be considerably reduced.

It should be noted that the embodiment of the invention described above is but one exemplary implementation of the prevention and that many other implementations may also be contemplated to realize the present invention. For instance, even though the preferred embodiment of the invention has been described with reference to the DC–DC converter incorporating therein the capacitors of the invention, it will be apparent to those skilled in the art that the present invention can be also implemented in other electronic circuits to obtain the same result. Electronic circuits which can incorporate the present invention to thereby exhibit significant effects of suppressing vibrations and audible sounds includes, but not limited thereto, an electronic circuit in which voltages applied to the capacitors 1a and 1b are variable, especially an electronic circuit in which applied voltages are continuously varied, a smoothing circuit of a power supply circuit in which the capacitors 1a and 1b are used as smoothing capacitors, and an electronic circuit in which frequencies of voltages applied to the capacitors 1a and 1b vary in the audible frequency band (20 Hz~20 KHz).

Further, the present invention is not intended to be limited to the above embodiment which prevents the vibrations from being generated by using two symmetrical capacitors 1a and 1b in lieu of a single capacitor of a prior art circuit.

For example, if two capacitors are used in different parts of a circuit and substantially identical voltages are applied thereto, the two capacitors can be disposed at the substantially plane-symmetrical positions on two opposite surfaces of a circuit board as described above to thereby suppress vibrations from being generated by the two capacitors.

Further, if two capacitors are used on two different circuits and substantially identical voltages are applied to the capacitors, it is also possible to suppress the vibrations generated by the capacitors by mounting these two capacitors at their substantially plane-symmetrical positions on front and back surfaces of a circuit board as described above.

While the present invention has been described with respect to the particular embodiments, it will be apparent to those skilled in the art that various changes and modifications may be made without departing from the spirit and scope of the invention as defined in the following claims.

What is claimed is:

1. A method for mounting multilayered ceramic capacitors on a circuit board, wherein each capacitor includes a body having dielectric layers formed of a dielectric ceramic material and internal electrode layers and a pair of external terminal electrodes formed on two sides of the body, the dielectric layers and the internal electrode layers being stacked alternately in the body and the internal electrode layers being connected in parallel to the external terminal electrodes in an alternate manner, the method comprising the steps of:

(a) preparing the circuit board having a front and a back surface on which lands for mounting the capacitors thereon are formed at substantially plane-symmetrical positions, wherein every two lands disposed at their substantially plane-symmetrical positions are connected to each other;

(b) mounting the capacitors on the lands of the front and the back surface to cancel out vibrations generated from the capacitors; and (c) electrically coupling the external terminal electrodes to the lands.

2. The method of claim 1, wherein a length, a width and a height of one of the capacitors range front about 70 to about 130% of those of the other capacitor, respectively, to cancel out the vibrations generated from the capacitors.

3. The method of claim 1, wherein offsets between the capacitors are less than about 30% of a length and a width of one of the capacitors along the directions of the length and the width, respectively, to cancel out the vibrations generated from the capacitors.

4. The method of claim 1, wherein an offset between center axes along length directions of the capacitors is less than 40 degrees to cancel out the vibrations generated from the capacitors.

5. The method of claim 1, wherein said every two lands are electrically coupled to each other by a through hole formed therein.

6. The method of claim 1, wherein substantially identical voltages are applied to the capacitors.

7. The method of claim 1, wherein the capacitors are used as a component of an electronic circuit in which voltages applied to the capacitors are varied.

8. The method of claim 1, wherein the capacitors are connected in parallel.

9. The method of claim 1, wherein voltages applied to the capacitors are varied.

10. The method of claim 1, wherein voltages applied to the capacitors have frequencies varying in an audible frequency band.

* * * * *